(12) United States Patent
Aouini et al.

(10) Patent No.: US 11,750,287 B2
(45) Date of Patent: Sep. 5, 2023

(54) OPTICAL DSP OPERATING AT HALF-BAUD RATE WITH FULL DATA RATE CONVERTERS

(71) Applicant: Ciena Corporation, Hanover, MD (US)

(72) Inventors: Sadok Aouini, Gatineau (CA); Robert G. Gibbins, Stittsville (CA); Yalmez Yazaw, Nepean (CA); Harvey Mah, Ottawa (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 311 days.

(21) Appl. No.: 17/329,335

(22) Filed: May 25, 2021

(65) Prior Publication Data

US 2022/0385365 A1    Dec. 1, 2022

(51) Int. Cl.
*H04B 10/2513* (2013.01)
*H04B 10/2569* (2013.01)
*H03M 1/00* (2006.01)

(52) U.S. Cl.
CPC ........ *H04B 10/25133* (2013.01); *H03M 1/00* (2013.01); *H04B 10/2569* (2013.01)

(58) Field of Classification Search
CPC H04B 10/25133; H04B 10/2569; H03M 1/00
USPC .......................................................... 398/135
See application file for complete search history.

(56) References Cited

U.S. PATENT DOCUMENTS

| | | | |
|---|---|---|---|
| 5,742,557 A | 4/1998 | Gibbins et al. | |
| 8,451,870 B1 | 5/2013 | Kurowski et al. | |
| 8,849,882 B2 | 9/2014 | Aouini et al. | |
| 8,855,215 B2 | 10/2014 | Roberts et al. | |
| 10,187,197 B2 | 1/2019 | Aouini et al. | |
| 10,281,523 B2 | 5/2019 | Aouini et al. | |
| 10,320,374 B2 | 6/2019 | Parvizi et al. | |
| 10,330,962 B1 | 6/2019 | Calvo et al. | |
| 10,374,623 B1 | 8/2019 | Oveis Gharan et al. | |
| 10,390,116 B1 * | 8/2019 | Fifer | H04L 7/042 |
| 10,425,099 B1 | 9/2019 | Aouini et al. | |

(Continued)

FOREIGN PATENT DOCUMENTS

| | | |
|---|---|---|
| CA | 2 180 421 C | 2/1997 |
| CA | 2 206 738 A1 | 12/1998 |

(Continued)

OTHER PUBLICATIONS

Zhou et al; Rate-Adaptable Optics for Next Generation Long-Haul Transport Networks Mar. 2013; IEEE; pp. 1-9. (Year: 2013).*

(Continued)

*Primary Examiner* — Amritbir K Sandhu
(74) *Attorney, Agent, or Firm* — Baratta Law PLLC; Lawrence A. Baratta, Jr.

(57) ABSTRACT

An optical Digital Signal Processor (DSP) circuit includes a digital core configured to implement digital signal processing functionality and configured to operate at a plurality of baud rates including a full baud rate and a half-baud rate; and an analog interface including a Digital-to-Analog Converter (DAC) section and an Analog-to-Digital Converter (ADC) section, wherein the analog interface is connected to the digital core and is configured to operate at the full baud rate when the digital core is configured to operate at any of the plurality of baud rates.

20 Claims, 6 Drawing Sheets

(56) References Cited

U.S. PATENT DOCUMENTS

| | | | |
|---|---|---|---|
| 10,536,303 | B1 | 1/2020 | Pike et al. |
| 10,554,453 | B1 | 2/2020 | Parvizi et al. |
| 10,678,112 | B2 | 6/2020 | Parvizi et al. |
| 10,680,585 | B2 | 6/2020 | Aouini et al. |
| 10,715,155 | B1 | 7/2020 | Parvizi et al. |
| 10,715,169 | B1 | 7/2020 | Aouini et al. |
| 10,727,854 | B1 | 7/2020 | Greshishchev et al. |
| 10,749,536 | B1 | 8/2020 | Aouini et al. |
| 10,805,064 | B1 | 10/2020 | Aouini et al. |
| 10,826,514 | B1 | 11/2020 | Honarparvar et al. |
| 10,848,164 | B1 | 11/2020 | Wen et al. |
| 10,855,380 | B2 | 12/2020 | Aouini et al. |
| 2005/0071594 | A1 | 3/2005 | Jarabek et al. |
| 2016/0105236 | A1* | 4/2016 | Zhang ................ H04B 10/5161 398/140 |
| 2020/0177194 | A1 | 6/2020 | Aouini et al. |
| 2022/0171425 | A1* | 6/2022 | Parvizi ..................... G06F 7/68 |

FOREIGN PATENT DOCUMENTS

| | | | | |
|---|---|---|---|---|
| CA | 2 269 914 | A1 | 12/1998 | |
| EP | 3217559 | B1 | 8/2019 | |
| EP | 3672111 | A1 * | 6/2020 | ....... H04B 10/25073 |

OTHER PUBLICATIONS

Alexander et al., "Not All Coherent Solutions CAN be Created Equal", Ciena Corporation, Aug. 2017, pp. 1-24.

* cited by examiner

OPTICAL DSP OPERATING AT HALF-BAUD RATE WITH FULL DATA RATE CONVERTERS

FIELD OF THE DISCLOSURE

The present disclosure generally relates to electrical circuits. More particularly, the present disclosure relates to systems and methods for an Optical Digital Signal Processor (DSP) operating at half-baud rate with full data rate converters.

BACKGROUND OF THE DISCLOSURE

Optical modems utilize optical DSP circuits to support various functions for transmitting and receiving data, including, e.g., coherent modulation/demodulation, Forward Error Correction (FEC) encoding/decoding, digital filtering, dispersion mitigation, spectral shaping, and the like. An example of optical DSPs includes the WaveLogic family available from Ciena Corporation, the applicant of the present disclosure. Each optical DSP can be configured to operate at programmable baud rates, such as, e.g., between 60 to 95 gigabaud, 35 gigabaud, etc. Also, each optical DSP includes data rate converters, namely Digital-to-Analog Converters (DACs) and Analog-to-Digital Converters (ADCs), which are configured to operate at the full data rate of the optical DSP. These data rate converters operate at extremely high speed and are tuned to support a given sample rate or a small range of sample rates. There are applications where the optical DSP may be used in a so-called half-baud rate configuration. For example, the half-baud rate configuration may be in a free-space optics configuration, such as between Low Earth Orbit Satellites (LEOS). Of note, the high-speed clocks, Voltage Controlled Oscillators (VCOs), and Radio Frequency (RF) portion of the data rate converters are tuned; it is not possible to simply half the sample rate. To support both full baud and half-baud rates, the data converters would need to operate over a wide range of frequencies/sample-rate which might not be applicable for high-speed designs.

BRIEF SUMMARY OF THE DISCLOSURE

The present disclosure relates to systems and methods for an Optical Digital Signal Processor (DSP) operating at a half-baud rate with full data rate converters. To do so, the present disclosure supports the half-baud rate in the DSP without impacting the analog macro design for the data rate converters. An extra divider and a multiplexer are utilized to half the clock going from the analog macro to the digital core interface. The optical DSP can be configured to operate in either a full baud rate or half-baud rate configuration while the data rate converters remain configured to support full rates. To support half-baud rates without impacting the data rate converters, the approach described herein leaves the core of the analog as-is while providing a new divide by two to the clock to the digital core. In a half-baud rate configuration, a data path rate-changing data mapper is enabled, which receives half-rate data but hands off to the DAC at the full rate in such a manner that each byte of the multi-byte ½ rate data word is exported twice in succession at the full baud rate. Similarly, in the half-baud rate configuration, a data path rate-changing data mapper is enabled, which receives data from the ADC at full rate but hands off at half-rate in such a manner that every second byte in two successively received multi-byte words is discarded, and the remaining bytes are combined and exported at half-rate.

In an embodiment, an optical Digital Signal Processor (DSP) circuit includes a digital core configured to implement digital signal processing functionality and configured to operate at a plurality of baud rates, including a full baud rate and a half-baud rate; and an analog interface including a Digital-to-Analog Converter (DAC) section and an Analog-to-Digital Converter (ADC) section, wherein the analog interface is connected to the digital core and is configured to operate at the full baud rate when the digital core is configured to operate at any of the plurality of baud rates. The analog interface can include a plurality of dividers and multiplexers to half a clock from the analog interface to the digital core when the digital core operates at the half-baud rate.

The digital signal processing functionality can include any of programmable coherent modulation/demodulation, dispersion compensation, Polarization Mode Dispersion (PMD) compensation, nonlinear pre and/or post-compensation, Forward Error Correction (FEC), and performance monitoring. The digital signal processing functionality can include functionality for a coherent optical modem supporting capacity of at least 200 Gb/s, and wherein the half-baud rate is configured to support free-space optics or pluggable coherent modules operating at less than the capacity. The full baud rate can be between 30 and 100 Gbaud. The full baud rate of the optical DSP can be adjustable.

In another embodiment, a method of operating an optical Digital Signal Processor (DSP) circuit includes configuring a digital core to operate at a plurality of baud rates, including a full baud rate and a half-baud rate; implementing digital signal processing functionality in the digital core at a configured baud rate; and operating an analog interface, connected to the digital core, at the full baud rate when the digital core is configured to operate at any of the plurality of baud rates, wherein the analog interface includes a Digital-to-Analog Converter (DAC) section and an Analog-to-Digital Converter (ADC) section. The analog interface can include a plurality of dividers and multiplexers to half a clock from the analog interface to the digital core when the digital core operates at the half-baud rate.

The digital signal processing functionality can include any of programmable coherent modulation/demodulation, dispersion compensation, Polarization Mode Dispersion (PMD) compensation, nonlinear pre and/or post-compensation, Forward Error Correction (FEC), and performance monitoring. The digital signal processing functionality can include functionality for a coherent optical modem supporting capacity of at least 200 Gb/s, and wherein the half-baud rate is configured to support free-space optics or pluggable coherent modules operating at less than the capacity. The full baud rate can be between 30 and 100 Gbaud.

In a further embodiment, a coherent optical modem includes an optical Digital Signal Processor (DSP) circuit including a digital core configured to implement digital signal processing functionality and configured to operate at a plurality of baud rates including a full baud rate and a half-baud rate; and an analog interface including a Digital-to-Analog Converter (DAC) section and an Analog-to-Digital Converter (ADC) section, wherein the analog interface is connected to the digital core and is configured to operate at the full baud rate when the digital core is configured to operate at any of the plurality of baud rates; and an electro-optic section configured to transmit and receive a coherently modulated optical signal for the digital signal processing functionality and at one of the full baud rate and the half-baud rate. The analog interface can include a plurality of dividers and multiplexers to half a clock from the analog interface to the digital core when the digital core operates at the half-baud rate.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure relates to systems and methods for an Optical Digital Signal Processor (DSP) operating at a half-baud rate with full data rate converters. To do so, the present disclosure supports the half-baud rate in the DSP without impacting the analog macro design for the data rate converters. An extra divider and a multiplexer are utilized to half the clock going from the analog macro to the digital core interface. The optical DSP can be configured to operate in either a full baud rate or half-baud rate configuration while the data rate converters remain configured to support full rates. To support half-baud rates without impacting the data rate converters, the approach described herein leaves the core of the analog as-is while providing a new divide by two to the clock to the digital core. In a half-baud rate configuration, a data path rate-changing data mapper is enabled, which receives half-rate data but hands off to the DAC at the full rate in such a manner that each byte of the multi-byte ½ rate data word is exported twice in succession at the full baud rate. Similarly, in the half-baud rate configuration, a data path rate-changing data mapper is enabled, which receives data from the ADC at full rate but hands off at half-rate in such a manner that every second byte in two successively received multi-byte words is discarded, and the remaining bytes are combined and exported at half-rate.

The proposed approach provides a means to achieve half-symbol-rate (i.e., baud rate) (or division by $2n$ symbol-rate) using data converters that are optimized for the original symbol-rate by sequentially sending at the full rate each byte in the half-rate data word, taking two full-rate DAC cycles to do so and dropping every second byte in each of two successive full-rate ADC data words and recombining the remaining bytes into one half-rate data word. The benefit is the support of half-symbol-rate mode without impacting the converter design in an optical DSP.

Figure 1:
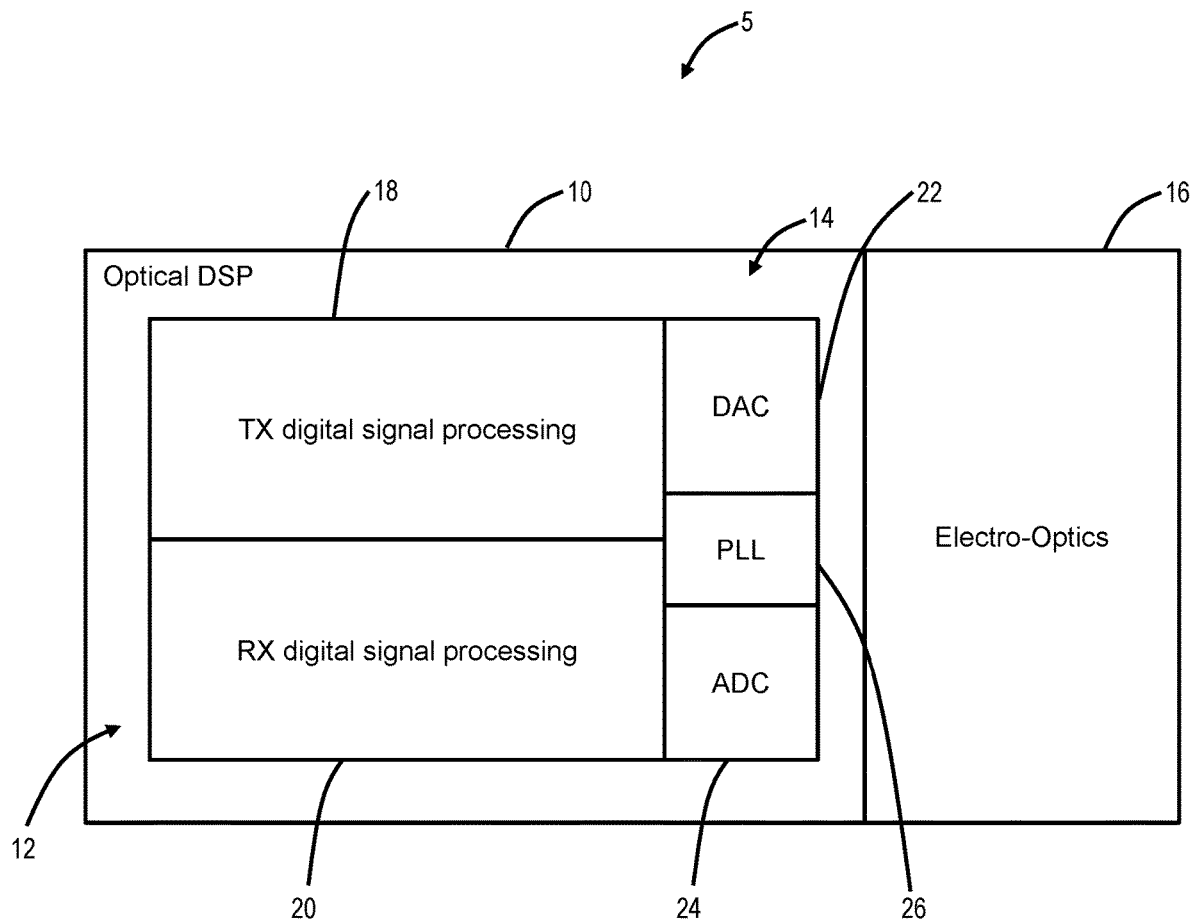
FIG. 1 is a block diagram of a coherent modem including an optical DSP with a digital core and an analog interface connected to an electro-optics section.

FIG. 1 is a block diagram of a coherent modem 5, including an optical DSP 10 with a digital core 12 and an analog interface 14 connected to an electro-optics section 16. The coherent modem 5 can be referred to as an optical transceiver, transponder, etc. The coherent modem 5 is configured to interface client traffic electrically and to provide line traffic optically, that is coherently modulated, to the electro-optics section 16. The coherent modem 5 can support dual-polarizations, i.e., an X-polarization and a Y-polarization (these may also be referred to as Horizontal and Vertical). As is known in the art, there are two ways to change the capacity of the coherent modem 5, namely changing the bits per symbol using different modulation schemes or changing the baud rate, which determines the number of symbols processed per second.

In an implementation, the baud rate of the optical DSP 10 is fixed and the capacity is changed by programmable modulation formats. The coherent modem 5 can support programmable modulation or constellations with both varying phase and/or amplitude. In an embodiment, the coherent modem 5 can support multiple coherent modulation formats such as, for example, i) dual-channel, Dual-Polarization (DP) Binary Phase-Shift Keying (BPSK) for 100 G at submarine distances, ii) DP Quadrature Phase-Shift Keying (QPSK) for 100 G at ultra long haul distances, iii) 16-Quadrature Amplitude Modulation (QAM) for 200 G at metro to regional (600 km) distances), or iv) dual-channel 16QAM for 400 G at metro to regional distances. In this embodiment, the same coherent modem 5 can support 100 G to 400 G. With associated configuration of the optical DSP 10, moving from one modulation format to another is completely software-programmable.

In another embodiment, the coherent modem 5 can support N-QAM modulation formats with and without dual-channel and dual-polarization where N can even be a real number and not necessarily an integer. Here, the coherent modem 5 can support non-standard speeds since N can be a real number as opposed to an integer, i.e., not just 100 G, 200 G, or 400 G, but variable speeds, such as 130 G, 270 G, 560 G, etc. These rates could be integer multiples of 25 Gb/s, 10 Gb/s, or of 1 Gb/s. Furthermore, with the DSP and software programming, the capacity of the coherent modem 5 can be adjusted upwards or downwards in a hitless manner so as to not affect the guaranteed rate. Additionally, the coherent modem 5 can tune and arbitrarily select spectrum; thus no optical filters are required. Additionally, the coherent modem 5, via the optical DSP 10, can support various aspects of nonlinear effect mitigation and dispersion compensation (both for chromatic and polarization mode) in the electrical domain, thus eliminating external dispersion compensation devices, filters, etc. The optical DSP 10 can also adapt the forward error correction coding that is used, as another method to trade-off service rate versus noise tolerance.

In a further embodiment, the optical DSP 10 can operate at 95 Gbaud to support programmable capacity rates from 200 G to 800 G in 25 G increments. 95 Gbaud was selected as the symbol rate because it allows for a maximum capacity of 800 G for practical short reach distances (100-200 km) and 800 G can efficiently carry multiples of both 100 Gigabit Ethernet (GE) and emerging 400 GE services. It also allows for efficient transport of 400 GE services across any distance, so 400 GE can be carried across the longest link in the network over a single wavelength, including transpacific distances.

Also, the optical DSP 10 can be configured to support a plurality of baud rates, including the ability to adjust the baud rate based on a configuration. As described herein, the full baud rate can be a primary baud rate, such as the highest baud rate the optical DSP 10 supports, and the half-baud rate can be half of the full baud rate. For example, the optical DSP 10 can be adjustable between specific baud rates ranging from 60 to 95 gigabaud. The baud rates can be chosen so that both fixed-grid 100 GHz channels and flexible grid ones are supported.

The optical DSP 10 includes a vast amount of digital functionality that is implemented in hard-coded, pre-programmed Application-Specific Integrated Circuits (ASICs). The digital core 12 includes Transmit (Tx) digital signal processing 18 and Receive (Rx) digital signal processing 20. The digital functionality can include, without limitation, programmable coherent modulation/demodulation, dispersion compensation, Polarization Mode Dispersion (PMD) compensation, nonlinear pre and/or post-compensation, Forward Error Correction (FEC), performance monitoring, and the like. High-gain soft-decision FEC enables signals to traverse longer distances while requiring fewer regenerator points. It provides more margin, allowing higher bit-rate signals to traverse farther distances. Spectral shaping provides greater capacity and increased spectral efficiency for super or media channels. Spectral shaping is critical in flexible grid systems because it allows carriers to be squeezed closer together to maximize capacity.

Programmability enables a wide variety of networks and applications so that the coherent modem 5 can support multiple modulation formats, enabling operators to choose from a variety of line rates. Fully programmable coherent modems 5 provide a wide range of tunability options with fine granularity between incremental capacities, enabling network operators to make use of all available capacity and convert excess margin into revenue-generating services. Strong mitigation to dispersion, which offers better optical performance at higher bit rates. Coherent processors must account for dispersion effects after the signal has been transmitted across the fiber, including compensating for Chromatic Dispersion (CD) and PMD via filters in the optical DSP 10. Additionally, the optical DSP 10 improves tolerances for Polarization-Dependent Loss (PDL) and tracks the State of Polarization (SOP) to avoid bit errors due to cycle slips that would otherwise affect optical performance.

The optical DSP 10 is built to efficiently address any metro, regional, long-haul, or submarine application. Due to the large Non-Recurring Engineering (NRE) cost, generally low volumes (for networking applications relative to other applications with higher volumes such as consumer devices, etc.), and short product lifecycle, approaches have ASIC-based devices (i.e., the optical DSP 10) hard-coded, pre-programmed to support multiple modes, such as for any metro, regional, long-haul, or submarine application. As described herein, a mode is some digital functionality implemented in the optical DSP 10. Thus, any coherent modem 5 used in one application would have all the functionality for the other applications, albeit disabled. For example, a detailed discussion of digital functionality in an optical DSP 10 is described in commonly-assigned U.S. Pat. No. 10,171,169, issued Jan. 1, 2019, and entitled "Software programmable flexible and dynamic optical transceivers," the contents of which are incorporated by reference in their entirety.

The analog interface 14 includes a DAC section 22, an ADC section 24, and a Phase Lock Loop (PLL) section 26. The analog interface 14 includes high-speed clocks, VCOs, and an RF portion. Those skilled in the art recognize practical embodiments of baud rates can be between 30-100 Gbaud and beyond for the optical DSP 10. As described herein, a full data rate is a baud rate that the optical DSP 10 was designed to operate at, e.g., 95 Gbaud, etc. The digital core 12 can be configured to operate at configurable baud rates. However, it is difficult to provide a wide range of support of rates for the analog interface 14, as described above.

The present disclosure relates to a configuration where the optical DSP 10 supports operating the digital core 12 at a half-baud rate while the analog interface 14 continues to operate at a full baud rate, but in a manner transparent to the half-rate digital core 12. In this manner, the DSP 10 can be supported in additional applications without impacting the analog interface 14 macro design. The circuitry here requires an extra divider and a mux to half the clock going from the analog interface 14 to the digital core 12.

Figure 2:
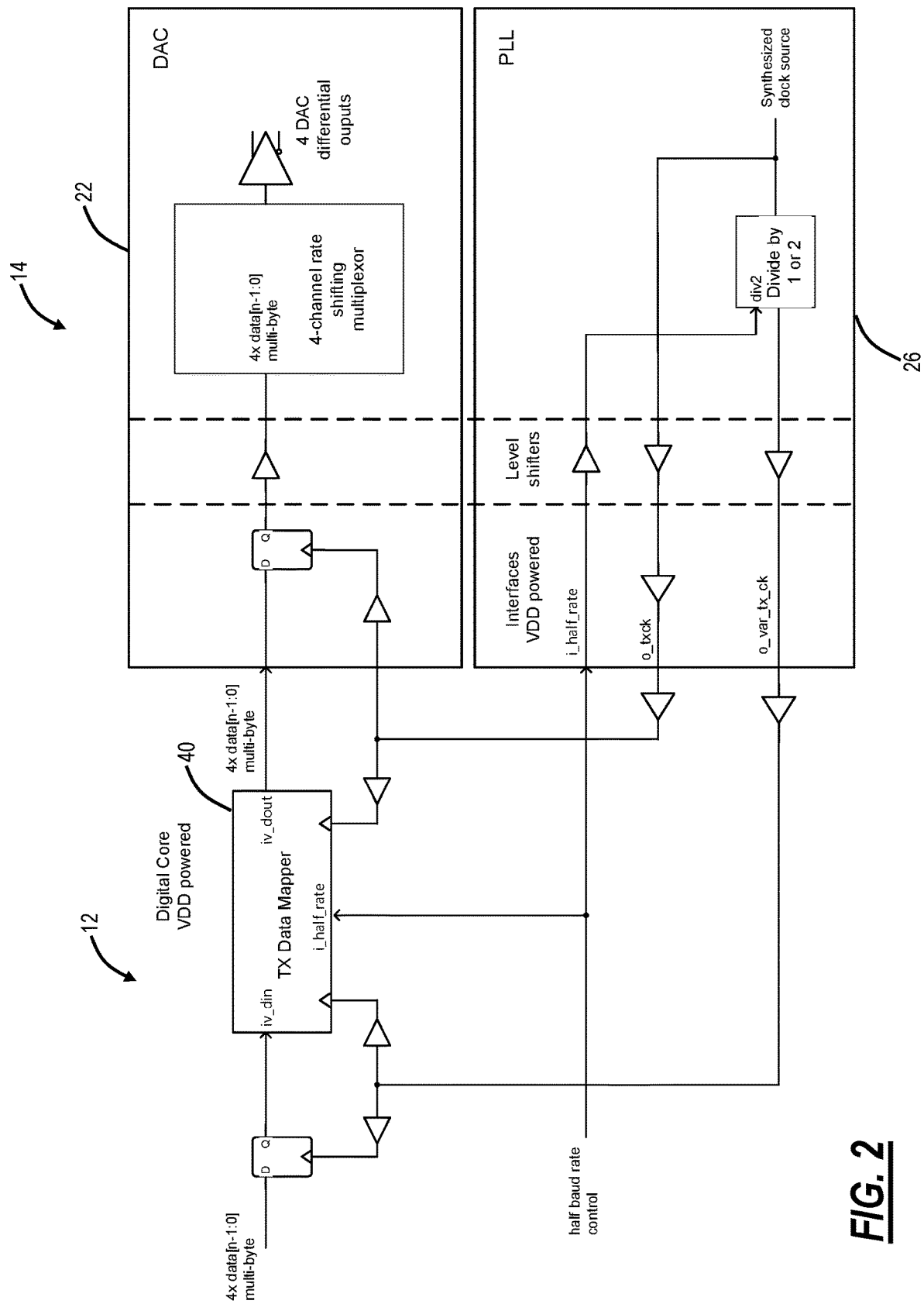
FIG. 2 is a circuit diagram of details of the Digital-to-Analog Converter (DAC) section and the Phase Lock Loop (PLL) section of the optical DSP in FIG. 1 and includes a digital data mapper to support a half-baud rate mode.
Figure 3:
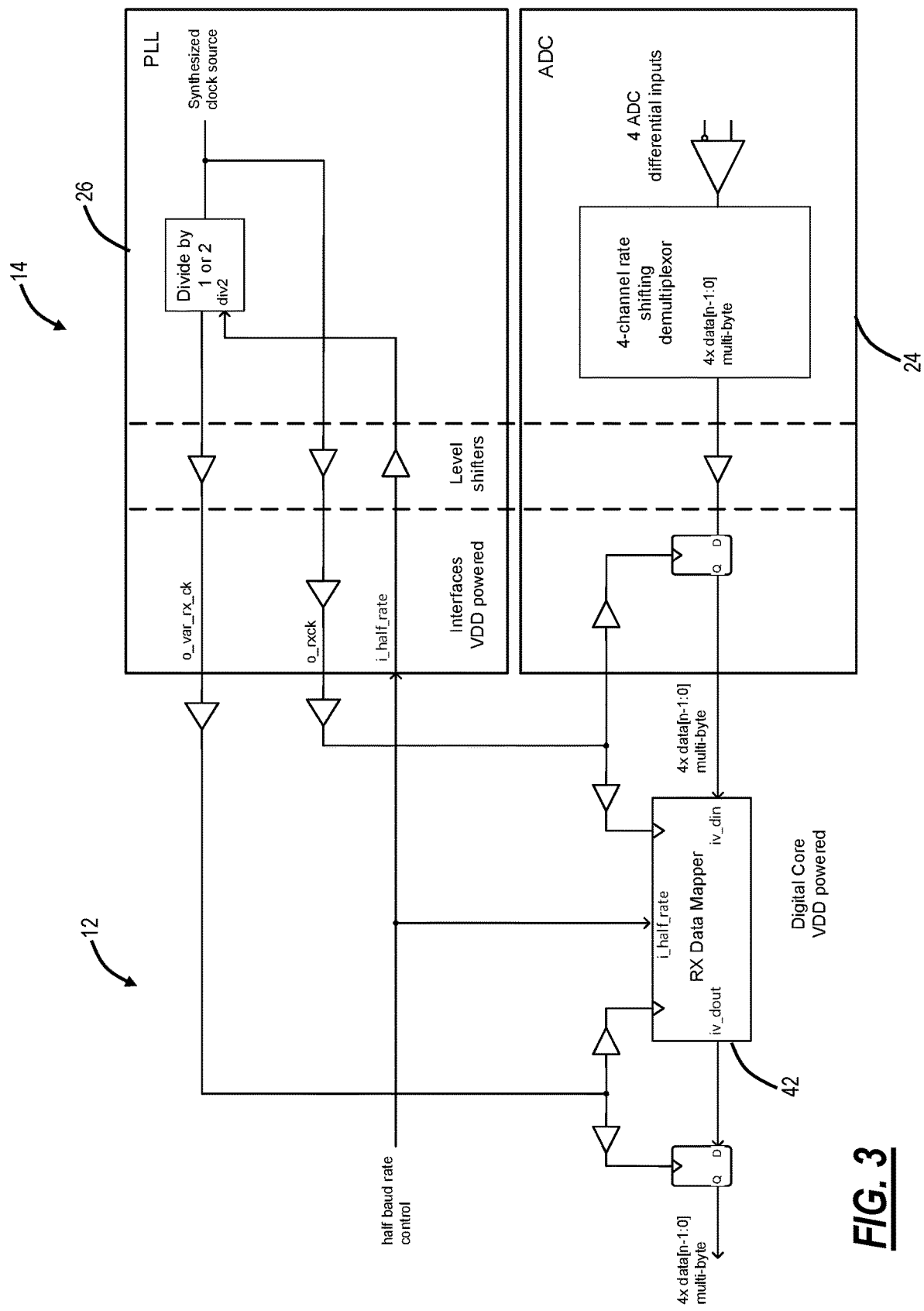
FIG. 3 is a circuit diagram of details of the Analog-to-Digital (ADC) section and the PLL section of the optical DSP in FIG. 1 and includes a digital data mapper to support a half-baud rate mode.
Figure 4:
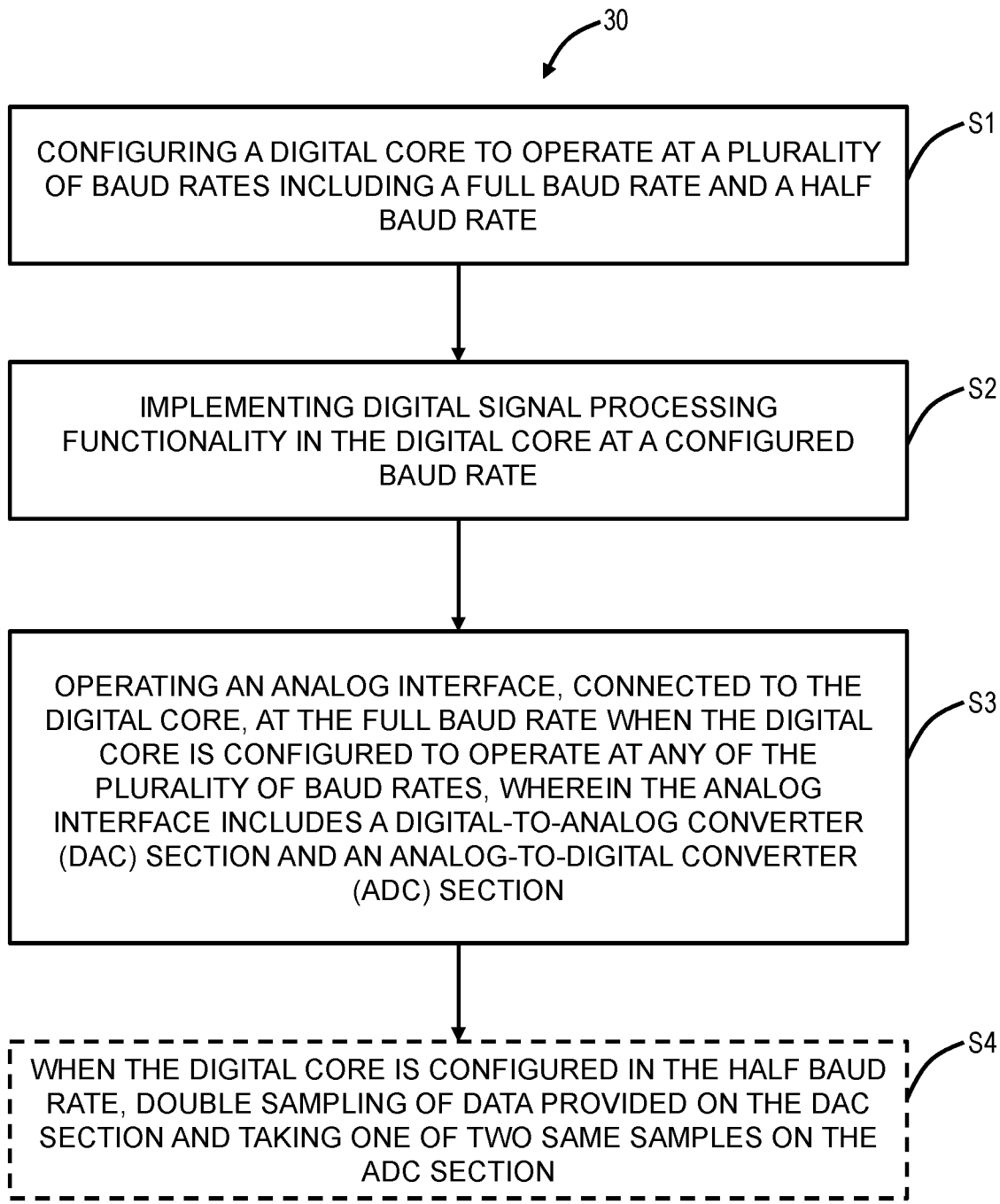
FIG. 4 is a flowchart of a process for operating the optical DSP in FIG. 1 at half-baud rate with full data rate converters.

FIG. 2 is a circuit diagram of details of the DAC section 22 and the PLL section 26 of the optical DSP 10 and a digital TX data mapper 40 to support full or half-baud rates. FIG. 3 is a circuit diagram of details of the ADC section 24 and the PLL section 26 of the optical DSP 10 and a digital RX data mapper 42 to support full or half-baud rates. FIG. 4 is a flowchart of a process 30 for operating the optical DSP 10 at half-baud rate with full data rate converters.

In an embodiment, the optical DSP 10 includes a digital core 12 configured to implement digital signal processing functionality and configured to operate at one of a full baud rate and a half-baud rate; and an analog interface 14 including a Digital-to-Analog Converter (DAC) section 22, an Analog-to-Digital Converter (ADC) section 24, and a Phase Lock Loop (PLL) section 26, wherein the analog interface 14 is connected to the digital core 12 and is configured to operate at the full baud rate when the digital core 12 is configured to operate at either one of the full baud rate and the half-baud rate.

In another embodiment, the coherent optical modem 5 includes the optical DSP 10 and the electro-optic section 16 configured to transmit and receive a coherently modulated optical signal for the digital signal processing functionality and at one of the full baud rate and the half-baud rate.

In a further embodiment, the process 30 includes configuring a digital core to operate at a plurality of baud rates including a full baud rate and a half-baud rate (step S1); implementing digital signal processing functionality in the digital core at a configured baud rate (step S2); and operating an analog interface, connected to the digital core, at the full baud rate when the digital core is configured to operate at any of the plurality of baud rates, wherein the analog interface includes a Digital-to-Analog Converter (DAC) section and an Analog-to-Digital Converter (ADC) section (step S3). The process 30 can include, when the digital core is configured in the half-baud rate, double sampling of data provided on the DAC section 22 and taking one of two same samples on the ADC section 24 (step S4).

In FIGS. 2 and 3, the analog interface includes a plurality of dividers and multiplexers to half a clock from the analog interface 14 to the digital core 12 when the digital core operates 12 at the half-baud rate. When the digital core 12 is configured in the half-baud rate, the data mappers 40, 42 are configured to convert the handoff. In a half-baud rate configuration, the data path rate-changing data mapper 40 is enabled to receive half-rate data but handoff to the DAC section 22 at the full rate in such a manner that each byte of the multi-byte ½ rate data word is exported twice in succession at the full baud rate. Similarly, in the half-baud rate configuration, the data path rate-changing data mapper 42 is enabled to receive data from the ADC section 24 at full rate but hands off at half-rate in such a manner that every second byte in two successively received multi-byte words is discarded, and the remaining bytes are combined and exported at half-rate Again, the present disclosure includes having the DAC, PLL and ADC macros continue to run at full rate, but in a manner transparent to the half-rate digital core. In an embodiment, in the half-rate mode, the DAC section 22 receives from the digital core at the full fs/160 rate two successive 160 parallel Unit Interval UI words, each UI comprising a byte. However, these two full-rate words map to the fs/320 rate 160 parallel UI as (first word) UI0, UI0, UI1, UI1, . . . UI79, UI79) and (second word) UI80, UI80, UI81, UI81, (UI159, UI159). The ADC section 24 provides two successive full rate 160 UI words that match the DAC encoding scheme for half-baud rate mode, and these are converted to the fs/320 rate 160 UI work by dropping every second UI in each word and then combining the two words.

Advantageously, only minor circuit changes to the PLL section 26 are needed to support this half-rate mode. In an embodiment, the digital core 12 works at half-rate: Onramp and offramp line clocks change from fs/160 to fs/320.

The digital signal processing functionality can include any of programmable coherent modulation/demodulation, dispersion compensation, Polarization Mode Dispersion (PMD) compensation, nonlinear pre and/or post-compensation, Forward Error Correction (FEC), and performance monitoring.

The digital signal processing functionality can include functionality for a coherent optical modem supporting capacity of at least 200 Gb/s, and wherein the half-baud rate is configured to support free-space optics or pluggable coherent modules operating at less than the capacity. The full baud rate can be between 30 and 100 Gbaud.

Again, the optical DSP 10 has a high NRE and it is desirable to avoid designing a new circuit for each individual application. The present disclosure envisions expanding the applications of the optical DSP 10 to include free-space optics use cases, such as for LEOS communication satellites as well for terrestrial applications. Further, the optical DSP 10 can also be used with pluggable optical modules such ZR, ZR+, etc. The advantage includes the use of the already designed optical DSP 10 in other applications, at half-baud rate, with no rate changes to the analog interface 14.

Figure 5:
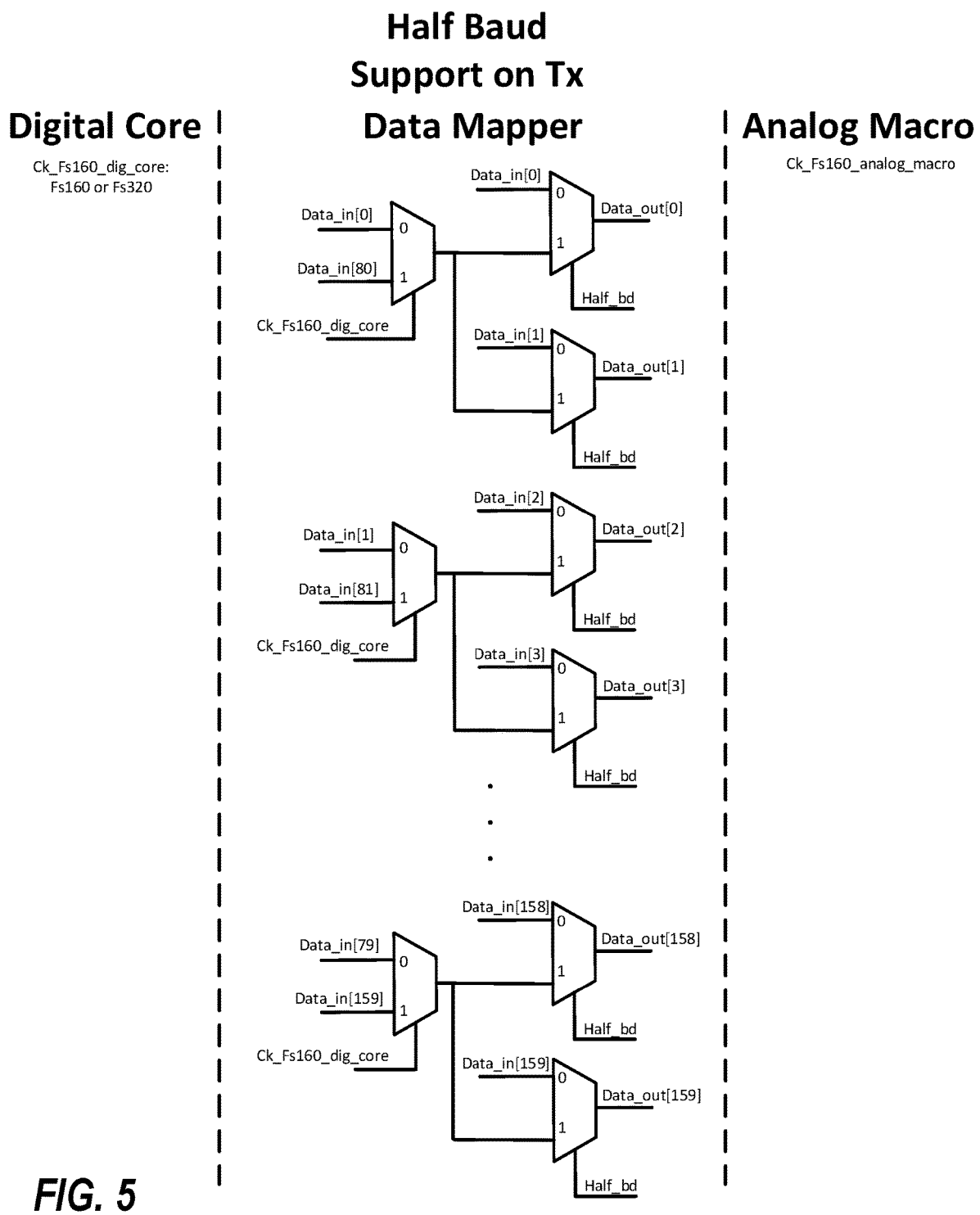
FIGS. 5 and 6 are circuit diagrams illustrating a data mapper between the digital core and the analog macro in both directions.
Figure 6:
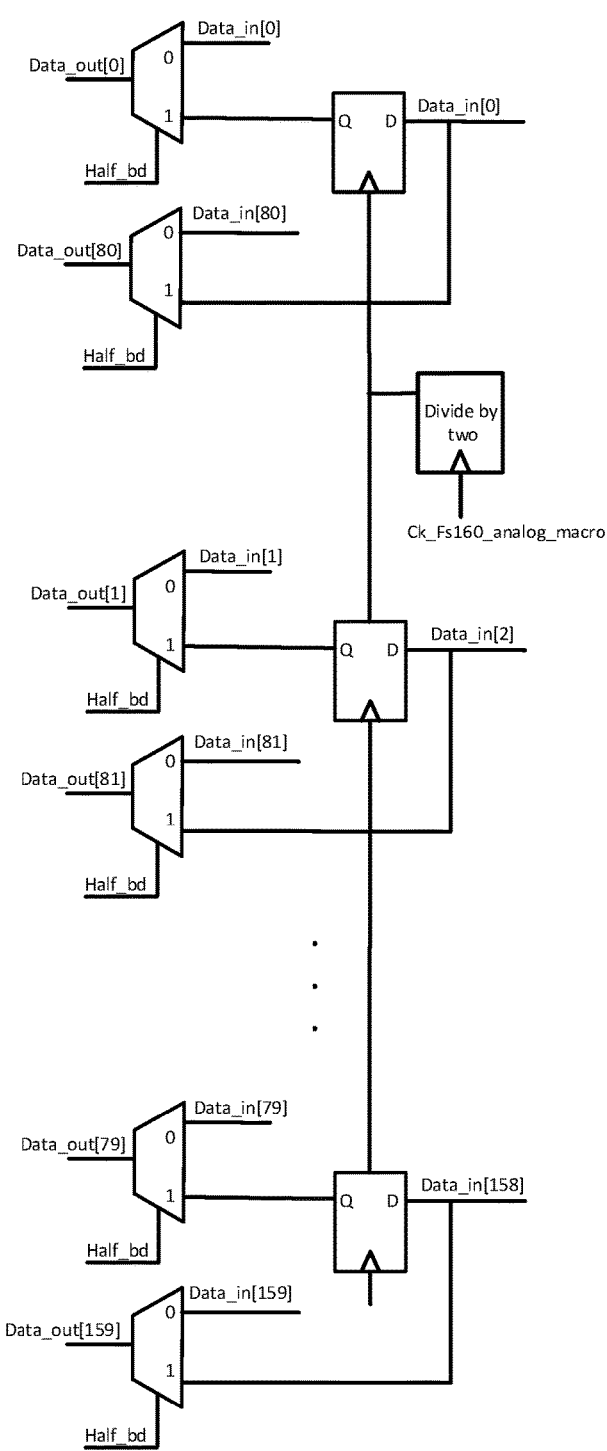

FIGS. 5 and 6 are circuit diagrams illustrating a data mapper between the digital core and the analog macro in both directions. Specifically, FIG. 5 illustrates data flow from the digital core to the analog macro. FIG. 6 illustrates data flow from the analog macro to the digital core. In both cases, the operation is configuration where the analog core operates at full baud, whereas the digital core operates either at full baud or half-baud. In an embodiment, FIGS. 5 and 6 represent an implementation of the data mappers 40, 42, respectively. In FIG. 5, the TX data mapper 40 can be implemented by muxes that provide data out as either full-rate or the same data twice for the half-baud. In FIG. 6, the RX data mapper 42 can be implemented with demuxes and flip flops. Only the even Data_in's are used, 80 in total. This is because in the half-rate mode, Data_in[1], for example, carries the same information as Data_in[0]—both are UI0 for the first fs/160 fetch, and both are UI80 for the second fs/160 fetch.

For RX timing, assume that all 160 Data_outs are immediately retimed with flops clocked by the rising edge of digital core clock, at rate fs/320 in the half-baud rate mode. Also assume the 80 Data_in flops shown are clocked by an fs/320 rate clock which is 180 degrees out of phase wrt the Data_out clock. For an fs/160-rate fetch of the 160 UI data_in bus containing UI0, UI0, UI1, UI1 . . . UI79, UI79, the 80 data_in flops hold and stretch this into fs/320 data. On the subsequent fs/160-rate fetch, for which the data bus contains UI80, UI80, UI81, UI81 . . . UI159, UI159, the 160 data_out flop's fs/320 clock captures both this data and the stretched data from the previous fetch.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. An optical Digital Signal Processor (DSP) circuit comprising:
   a digital core configured to implement digital signal processing functionality and configured to operate at a plurality of baud rates including a full baud rate and a half-baud rate; and an analog interface comprising a Digital-to-Analog Converter (DAC) section and an Analog-to-Digital Converter (ADC) section, wherein the analog interface is connected to the digital core and is configured to operate at the full baud rate when the digital core is configured to operate at any of the plurality of baud rates, wherein the analog interface includes a plurality of dividers and multiplexers to half a clock from the analog interface to the digital core when the digital core operates at the half-baud rate.

2. The optical DSP of claim 1, further comprising
a transmit data mapper between the digital core and the DAC section; and
a receive data mapper between the digital core and the ADC section.

3. The optical DSP of claim 2, wherein the transmit data mapper is configured to receive half-rate data from the digital core and hand off to the DAC section at the full baud rate in such a manner that each byte is exported twice in succession at the full baud rate.

4. The optical DSP of claim 2, wherein the receive data mapper is configured to receive data from the ADC section at full rate and hand off at half-rate in such a manner that every second byte in two successively received multi-byte words is discarded and the remaining bytes are combined and exported at half-rate.

5. The optical DSP of claim 1, wherein the digital signal processing functionality includes any of programmable coherent modulation/demodulation, dispersion compensation, Polarization Mode Dispersion (PMD) compensation, nonlinear pre and/or post-compensation, Forward Error Correction (FEC), and performance monitoring.

6. The optical DSP of claim 1, wherein the digital signal processing functionality includes functionality for a coherent optical modem supporting capacity of at least 200 Gb/s, and wherein the half-baud rate is configured to support free-space optics or pluggable coherent modules operating at less than the capacity.

7. The optical DSP of claim 1, wherein the full baud rate is between 30 and 100 Gbaud.

8. The optical DSP of claim 1, wherein the full baud rate of the optical DSP is adjustable.

9. An optical Digital Signal Processor (DSP) circuit comprising:
a digital core configured to implement digital signal processing functionality and configured to operate at a plurality of baud rates including a full baud rate and a half-baud rate;
an analog interface comprising a Digital-to-Analog Converter (DAC) section and an Analog-to-Digital Converter (ADC) section, wherein the analog interface is connected to the digital core and is configured to operate at the full baud rate when the digital core is configured to operate at any of the plurality of baud rates;
a transmit data mapper between the digital core and the DAC section, wherein the transmit data mapper is configured to receive half-rate data from the digital core and hand off to the DAC section at the full baud rate in such a manner that each byte is exported twice in succession at the full baud rate; and
a receive data mapper between the digital core and the ADC section, wherein the receive data mapper is configured to receive data from the ADC section at full rate and hand off at half-rate in such a manner that every second byte in two successively received multi-byte words is discarded and the remaining bytes are combined and exported at half-rate.

10. The optical DSP of claim 9, wherein the analog interface includes a plurality of dividers and multiplexers to half a clock from the analog interface to the digital core when the digital core operates at the half-baud rate.

11. The optical DSP of claim 9, wherein the digital signal processing functionality includes any of programmable coherent modulation/demodulation, dispersion compensation, Polarization Mode Dispersion (PMD) compensation, nonlinear pre and/or post-compensation, Forward Error Correction (FEC), and performance monitoring.

12. The optical DSP of claim 9, wherein the digital signal processing functionality includes functionality for a coherent optical modem supporting capacity of at least 200 Gb/s, and wherein the half-baud rate is configured to support free-space optics or pluggable coherent modules operating at less than the capacity.

13. The optical DSP of claim 9, wherein the full baud rate is between 30 and 100 Gbaud.

14. The optical DSP of claim 9, wherein the full baud rate of the optical DSP is adjustable.

15. An optical Digital Signal Processor (DSP) circuit comprising:
a digital core configured to implement digital signal processing functionality and configured to operate at a plurality of baud rates including a full baud rate and a half-baud rate; and
an analog interface comprising a Digital-to-Analog Converter (DAC) section and an Analog-to-Digital Converter (ADC) section, wherein the analog interface is connected to the digital core and is configured to operate at the full baud rate when the digital core is configured to operate at any of the plurality of baud rates,
wherein the digital signal processing functionality includes functionality for a coherent optical modem supporting capacity of at least 200 Gb/s, and wherein the half-baud rate is configured to support free-space optics or pluggable coherent modules operating at less than the capacity.

16. The optical DSP of claim 15, wherein the analog interface includes a plurality of dividers and multiplexers to half a clock from the analog interface to the digital core when the digital core operates at the half-baud rate.

17. The optical DSP of claim 15, further comprising
a transmit data mapper between the digital core and the DAC section; and
a receive data mapper between the digital core and the ADC section.

18. The optical DSP of claim 15, wherein the digital signal processing functionality includes any of programmable coherent modulation/demodulation, dispersion compensation, Polarization Mode Dispersion (PMD) compensation, nonlinear pre and/or post-compensation, Forward Error Correction (FEC), and performance monitoring.

19. The optical DSP of claim 15, wherein the full baud rate is between 30 and 100 Gbaud.

20. The optical DSP of claim 15, wherein the full baud rate of the optical DSP is adjustable.

* * * * *